United States Patent [19]

Kanai et al.

[11] Patent Number: 5,059,566
[45] Date of Patent: Oct. 22, 1991

[54] HIGH-DIELECTRIC CONSTANT CERAMIC COMPOSITE AND CERAMIC CAPACITOR ELEMENTS

[75] Inventors: Hideyuki Kanai; Yohachi Yamashita; Osamu Furukawa; Mitsuo Harata, all of Kanagawa, Japan

[73] Assignee: Kabushiki Kaisha Toshiba, Kawasaki, Japan

[21] Appl. No.: 457,502

[22] Filed: Dec. 27, 1989

[30] Foreign Application Priority Data

Dec. 27, 1988 [JP] Japan .................................. 63-327589
Feb. 22, 1989 [JP] Japan .................................... 1-40195

[51] Int. Cl.$^5$ ............................................. C04B 35/46
[52] U.S. Cl. .................................. 501/138; 501/135; 361/321
[58] Field of Search ............... 501/134, 135, 136, 137, 501/138; 361/320, 321 C, 321 CC, 321 R, 321 T, 321 F

[56] References Cited

U.S. PATENT DOCUMENTS 4,335,216  6/1982  Hodgkins et al. ..................... 501/32
4,704,373 11/1987  Kinoshita ............................ 501/136
4,709,299 11/1987  Kishi .................................. 361/321
4,749,668  6/1988  Fujino ................................ 501/134
4,753,905  6/1988  Nishioka ............................ 501/136
4,809,131  2/1989  Chazono ............................ 361/321
4,818,736  4/1989  Yamashita ......................... 501/136

FOREIGN PATENT DOCUMENTS 62-254310 11/1987 Japan .
63-248111 10/1988 Japan .

Primary Examiner—William R. Dixon, Jr.
Assistant Examiner—Chris Gallo
Attorney, Agent, or Firm—Oblon, Spivak, McClelland, Maier & Neustadt

[57] ABSTRACT

A high-dielectric constant ceramic composite is provided in which an appropriate amount of glass component is added to a composite of the $BaTiO_3$-$PbMO_3$ group having a low temperature coefficient in the dielectric constant thereof. The added glass component serves to maintain the satisfactory properties of the ceramic composite even after various types of reliability tests.

26 Claims, 2 Drawing Sheets

{ 5,059,566 }

HIGH-DIELECTRIC CONSTANT CERAMIC COMPOSITE AND CERAMIC CAPACITOR ELEMENTS

BACKGROUND OF THE INVENTION

1. Field of the Invention

This invention relates to a high-dielectric constant ceramic composite, and more particularly to a high-dielectric constant ceramic composite that can be satisfactorily employed as a dielectric material in a multilayer ceramic capacitor.

2. Description of the Prior Art

A dielectric material for use in ceramic capacitors is required to have electrical properties such as a high dielectric constant, a low temperature coefficient in the dielectric constant, and a small dielectric loss. Further, the required electrical properties include a dielectric constant which is less dependent on a biased electric field, and a large value of the product of its capacitance and the resistance, known as the CR value. To evaluate the reliability of a dielectric material, reliability tests such as a high-temperature load test, a high-humidity load test, and a heat-cycle test are performed.

In the process of manufacturing multilayer ceramic capacitors, the electrode materials and dielectric materials thereof are fired simultaneously. Thus, the firing temperature of the dielectric materials is required to be lower than 1100° C. This low firing temperature allows the use of Ag, which are less costly than Pt, Pd and the like, as the electrode material. For this reason, dielectric materials of the $BaTiO_3$ group have been widely used. However, in recent years, dielectric materials other than $BaTiO_3$, e.g., lead-based dielectric materials, which are called relaxors and represented by a general expression of $Pb(B_1, B_2)O_3$, have become of major interest. The lead-based dielectric materials serve o lower the firing temperature required for the process of manufacturing dielectrics of multilayer ceramic capacitors.

Further, the materials serve to improve the electrical an mechanical properties of the dielectrics employed in the capacitors. For this reason, there have been disclosed several relaxor, such as the lead iron niobate group disclosed in Japanese Laid Open Patent (J. L. O. P.) No. 57-57204, the magnesium-lead niobate group disclosed in J. L. O. P. No. 55-51758, and the lead magnesium tungstate group disclosed in J. L. 0. P. No. 52-21699. Further, the inventors of the present invention developed and disclosed the zinc-lead niobate group in J. L. 0. P.s No. 61-101460 and No. 61-155245.

As described above, various sorts of relaxor have been developed. However, the durability thereof under severe environmental conditions e.g. under a high-temperature load test) has not been sufficient. Moreover, when these relaxor are employed in the production of multilayer ceramic capacitors, the product of the capacitance and resistance is reduced during the high-temperature load test.

The inventors of this invention have disclosed a combined material of $BaTiO_3$ and $Pb(Zn_{\frac{1}{3}}Nb_{\frac{2}{3}})O_3$ as a high dielectric constant ceramic composite. The composite can be fired at a low temperature and has a low temperature coefficient of the dielectric constant. This material has been disclosed in Japanese Patent Application No. 63-156062.

In the view of the high-humidity load rest results alone, another improved composite has been disclosed in Japanese Patent Application No. 62-254310. Specifically, glass of $Bi_2O_3$-$SiO_2$-$B_2O_3$-$Ag_2O$ was added to a composite of $Pb(Zn_{\frac{1}{3}}Nb_{\frac{2}{3}})O_3$-$Pb(Mg_{\frac{1}{3}}-Nb_{\frac{2}{3}})O_3$-$PbTiO_3$. However, in this disclosure the heat-cycle test was not taken into consideration.

As described above, a satisfactory high-dielectric constant ceramic composite has not been obtained, which exhibits a low temperature coefficient of the dielectric constant and a small change in its properties under a heat-cycle test and a high-humidity load test.

SUMMARY OF THE INVENTION

Accordingly, one object of the present invention is to provide a high-dielectric constant ceramic composite having a low temperature coefficient in the dielectric constant and a small change in its properties under a heat-cycle test and a high-humidity load test. More particularly, the object of this invention is to provide a high-dielectric constant ceramic composite having satisfactory properties suitable for manufacturing multilayer ceramic capacitors.

Briefly, in accordance with one aspect of this invention, there is provided a high-dielectric constant ceramic composite which comprises a perovskite compound of the Pb group as a major component, and a glass component added to said perovskite compound, the glass component including the following constituents:

$B_2O_3$ of about 10 wt % to about 80 wt %,
$SiO_2$ of about 10 wt % to about 60 wt %,
$Al_2O_3$ of about 2 wt % to about 20 wt %,
$BaO$ of about 2 wt % to about 20 wt %, and
$MgO$ of about 2 wt % to about 20 wt %, wherein the total amount of the consitituents equals 100 wt %.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
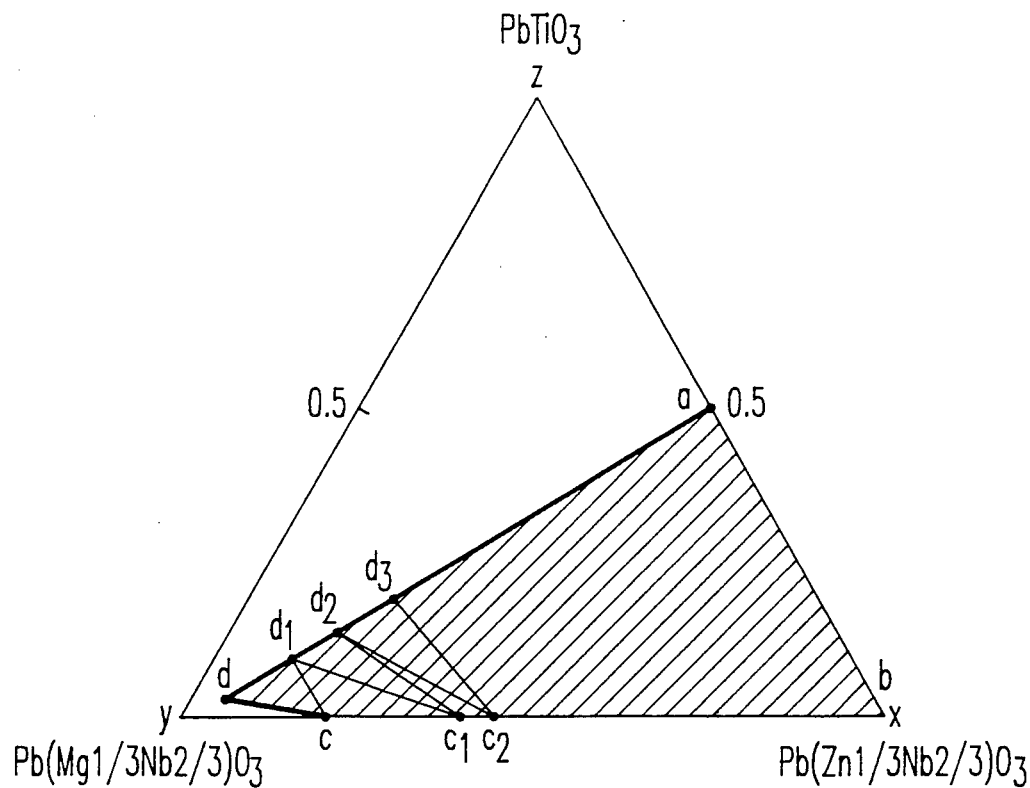
FIG. 1 is a ternary phase diagram illustrating an example of a major component of the dielectric material in a first embodiment according to the present invention.

Referring now to the drawings, wherein like reference numerals designate identical or corresponding parts throughout the several views, and more particularly to FIG. 1 thereof, a first embodiment of this invention will be described.

A first embodiment according to the present invention is high-dielectric constant ceramic composite which can be obtained in the following manner. Specifically, a glass component, which includes at least one of silicon and boron, is added to a relaxor component having a lead-based perovskite structure as a major component. The glass component includes the following constituents in the weight percentages given below:

$B_2O_3$ of about 10 wt % to about 80 wt %
$SiO_2$ of about 10 wt % to about 60 wt %
$Al_2O_3$ about 2 wt % to about 20 wt %
BaO of about 2 wt % to about 20 wt %
MgO of about 2 wt % to about 20 wt %, wherein the total amount of the constituents equals 100 wt %. Here, the amount of the glass component to be added to the relaxor component must be 1 wt % at a maximum.

Moreover, the inventors of the present invention have studied and discovered a highly reliable ceramic composite. Specifically, the composite has significantly improved the life performance under the high-temperature and load humidity tests. This can be achieved by adding a particularly prepared glass component to the relaxor component by a prescribed amount. The glass component includes $Al_2O_3$, BaO, SrO, CaO and MgO of about 20 wt % at a maximum. Further, the thus discovered composite can be manufactured by firing at lower temperatures. Moreover, the composite exhibits a high withstand voltage and a dielectric constant less dependent on the D.C. biased electric field. Further, the glass component may also include lead by 50 wt % at a maximum. However, when the content of lead is more than 50 wt %, the composite deteriorates in durability under the high-humidity load test. When the content of lead is less than 35 wt %, the composite improves its reliability. Moreover, when even a small amount f lead, i.e., about 1 wt % is added to the glass component, the reliability of the composite can be significantly improved.

In U.S. Pat. No. 4,082,906, a glass component is added to a $BaTiO_3$-group material in order to lower the firing temperature. However, the glass component inevitably deteriorates the durability of the composite disclosed in this patent under the high-temperature load test. Such durability can be improved by use of the relaxor component having a lead-based perovskite structure as a major component.

The composite of this invention has $B_2O_3$ of about 10 wt % to about 80 wt %, and $SiO_2$ of about 10 wt % to about 60 wt %. This is because if the content of the $B_2O_3$ less than 10 wt % or more than 80 wt %, the composite deteriorates in durability under the high-temperature load life test. Further, if the content of $SiO_2$ is less than 10 wt %, the durability under the high-temperature load life test is not improved. If the content of the $SiO_2$ is more than 60 wt %, it would be difficult to form glass at lower temperatures. Moreover, the respective contents of $Al_2O_3$, BaO, SrO, CaO and MgO must be determined to be 20 wt % at a maximum. This is because if these contents are more than 20 wt %, the durability under high-temperature load life test would not be improved. The above-described SrO nd CaO are not essential. However, if the SrO and CaO are added by about 0.1 wt %, better durability can be obtained. Further, the respective contents of $Al_2O_3$, BaO and MgO must be determined to be 2 wt % at a minimum. This is because, if the contents are less than 2 wt %, the durability under the high-temperature load life test will not be improved. When even a small amount of the glass component is added to the relaxor component, this improves the properties of the composite of this invention. For example, when a glass component of 0.01 wt % is added to the relaxor component, increased durability of the composite and low firing temperature can be achieved. However, when the content of the glass component is more than 1.0 wt %, the dielectric constant of the composite is significantly lowered. Further, the dielectric loss of the composite will be increased. Thus, the content of the glass component must be 1.0 wt % at a maximum so as to maintain the advantageous properties of the relaxor component.

This invention relates to the advantage per se which are obtained by adding the above-described glass component. Thus, this invention is not limited to a certain particular technique in which the lass component is added. For example, the glass component may be added in the form of glass or in the form of the oxides of the components.

In this invention, various types of relaxor components may be employed. For example, there can be cited relaxor components including the following basic components, such as $Pb(Mg_{\frac{1}{3}}Nb_{\frac{2}{3}})O_3$, $Pb(Zn_{\frac{1}{3}}Nb_{\frac{2}{3}})O_3$, $PbTiO_3$, $PbZrO_3$, $Pb(Fe_{\frac{1}{2}}Nb_{\frac{1}{2}})O_3$, $Pb(Fe_{\frac{2}{3}}W_{\frac{1}{3}})O_3$, $Pb(Mg_{\frac{1}{2}}W_{\frac{1}{2}})O_3$ and $Pb(Ni_{\frac{1}{3}}Nb_{\frac{2}{3}})O_3$. Naturally, a complex group of these basic components may be employed. Further, the relaxor component may include various types of additives such as $MnO_2$, $Co_2O_3$, $La_2O_3$, $Sb_2O_3$, NiO, $ZrO_2$ and $Y_2O_3$ by an amount of 0.5 wt % at a maximum.

Here, assume that a material which includes at least 24e of the above-described $Pb(Mg_{\frac{1}{3}}Nb_{\frac{2}{3}})O_3$ and $Pb(Zn_{\frac{1}{3}}Nb_{\frac{2}{3}})O_3$ by the amount of 50 mol % at a minimum is employed as the relaxor component. This results in a satisfactory composite having a high dielectric constant and excellent life performance. In this case, he dielectric constant and insulation resistance of the material can be more significantly enhanced by substituting at least one of Ba, Sr and Ca for Pb atoms of 1 to 35 mol %.

More preferable relaxor component can be obtained in the following manner. Specifically, a part of the Pb (later described) is substituted by at least one of Ba and Sr by about 1 mol % to about 35 mol %. Here, the above-described part of the Pb is defined as follows. First, assume that the perovskite compound, which is a major component of the relaxer, is represented by the general expression of $xPb(Zn_{\frac{1}{3}}Nb_{\frac{2}{3}})O_3$—$yPb(Mg_{\frac{1}{3}}Nb_{\frac{2}{3}})O_3$—$zPbTiO_3$. Three components of this expression are shown as apexes x, y and z in a prescribed ternary phase diagram of FIG. 1. The above-described part of the Pb is limited to the area surrounded by lines a—b, b—c, c—d and d—a, including those points on all the lines except line a—b. In FIG. 1, the respective points are determined as follows, a (x=0.50, y=0,00, and z=0.50),
b (x=1.00, y=0.00, and z=0.00),
c (x=0.20, y=0.80, and z=0.00), and
d (x=0.05, y=0.90, and z=0.05).

As described above, the basic composite of this embodiment is limited to the area surrounded by the lines connected to the points a, b, c and d, as shown in FIG. 1. This is because when the basic composite is presnet outside the area, e.g., beyond the line a—d, the firing temperature is required to be 1100° C. or higher. Further, the insulation resistance of the composite is lowered, and thus the product of the capacitance and the resistance thereof is also lowered. Moreover, when the basic composite is present beyond the line c—d, the dielectric constant thereof is significantly lowered. This is because the Curie temperature thereof is originally in the region of normal temperature, and the substitution by the Me component can easily occur. Further, when the point d changes to a point $d_1$ (where $x=0.10$, $y=0.80$ and $z=0.10$), the area inside the line c—$d_1$ is more preferable, as shown in FIG. 1.

When a small amount of lead magnesium niobate is added to the composite of this embodiment, the advantages thereof can be obtained. However, amounts greater than 1 mol % thereof are preferable in a practical application. In order to increase the CR value (the product of capacitance and resistance, Zinc-lead niobate of 15 mol % must be included. More preferably, 20 mol % or more thereof must be included. When more than 20 mol % thereof is included, the dielectric loss will be significantly reduced. Further, assume that the points c and d change respectively to points $c_1$, $c_2$, $d_2$, and $d_3$. Specifically, in FIG. 1, the respective points are defined as follows:

$c_1$ ($x=0.40$, $y=0.60$, and $z=0.00$),
$c_2$ ($x=0.45$, $y=0.55$, and $z=0.00$),
$d_2$ ($x=0.15$, $y=0.70$, and $z=0.15$), and
$d_3$ ($x=0.20$, $y=0.60$, and $z=0.20$).

In view of the CR value. T.C.C. (temperature coefficient of dielectric constant) and sintering properties, the basic composite must be present inside the line $c_1$—$d_2$, preferably inside the line $c_2$—$d_2$ and more preferably inside the line $c_2$—$d_3$. However, in view of the dielectric constant alone, satisfactory properties can be obtained even when the basic composite is present in the area defined by the lines connected respectively to the points a, b, c and d. More preferably, the basic composite includes $yPb(Mg_\frac{1}{3}Nb_\frac{2}{3})O_3$ as of $y \geq 0.01$, $zPbTiO_3$ as of $z \geq 0.01$, $Pb(Mg_\frac{1}{3}Nb_\frac{2}{3})O_3$, and $PbTiO_3$.

Further, the elements Ba and Sr are necessary to form the perovskite structure of the above-described general expression. When the contents of the Ba and Sr are less than 1 mol %, a pyrochroite structure is inevitably mixed in the perovskite structure. As a result, a high dielectric constant and a high insulation resistance cannot be obtained. However, if the contents of the Ba and Sr are more than 35 mol %, the dielectric constant would decrease to about 1000 or less. Thus, the contents of Ba and Sr must be determined to be $0.01 < a < 0.35$ where the substitution amount in the Me component is represented by $(Pb_{1-a}Me_a)$.

Figure 2:
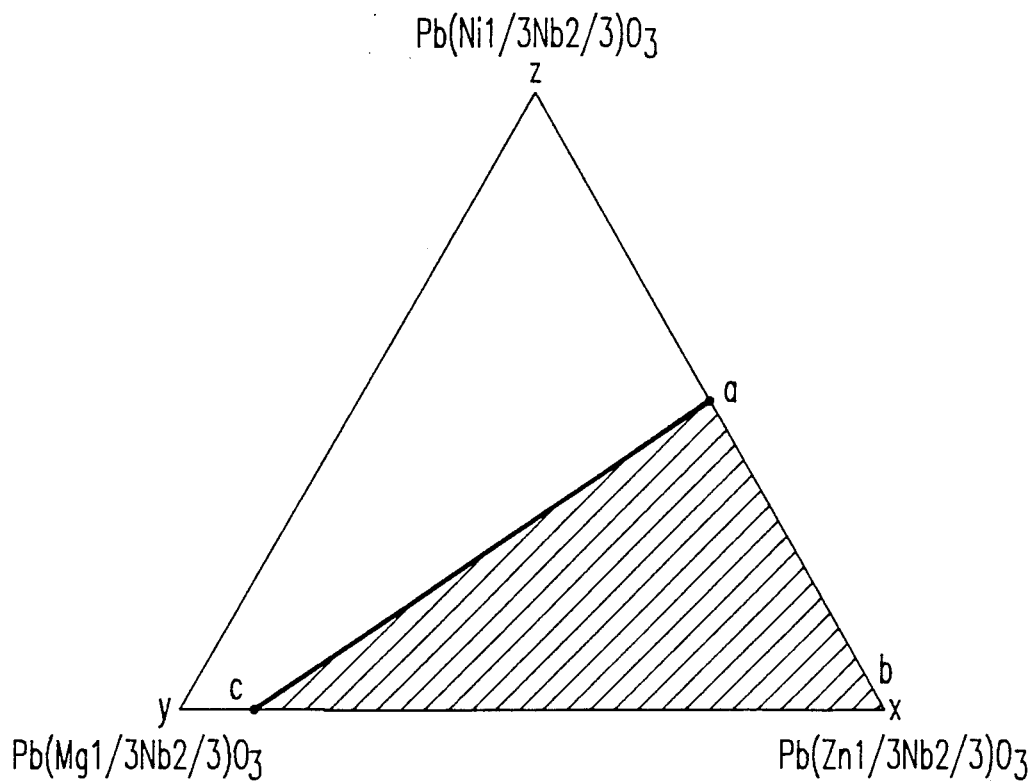
FIG. 2 is a ternary phase diagram illustrating another example of a major component of the dielectric material in the first embodiment according to the present invention.

In addition, the basic composite of this embodiment can be obtained in the following manner. Specifically, a part of the Pb (later described) is substituted by at least one of Ba and Sr by about 1 mol % to about 30 mol %. Here, the above-described part of the Pb is defined by using the general expression of $xPb(Zn_\frac{1}{3}Nb_\frac{2}{3})O_3$—$yPb(Mg_\frac{1}{3}Nb_\frac{2}{3})O_3$—$zPb(Ni_\frac{1}{3}Nb_\frac{2}{3})O_3$. Three components of this expression are shown as apexes x, y and z in a prescribed ternary phase diagram of FIG. 2. The above-described part of the Pb is limited in the area surrounded by lines a—b, b—c and c—a except for those points on the lines. In this chart, the respective points are determined as follows, a ($x=0.50$, $y=0.00$, and $z=0.50$),
b ($x=1.00$, $y=0.00$, and $z=0.00$), and
c ($x=0.10$, $y=0.90$, and $z=0.00$).

Further, the basic composite of this embodiment can be obtained in a similar manner as above, except for the following limitations. Specifically, the general expression to be applied is $(1-x)(Pb_{1-a-b}Ba_aSr_b)$—{(- 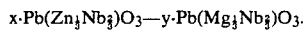$Zn_\frac{1}{3}Nb_\frac{2}{3})_{1-a-d}(Mg_\frac{1}{3}Nb_\frac{2}{3})Ti_d$}$O_3$. $xBaTiO_3$, where the following conditions must be satisfied:

$0 \leq a \leq 0.35$,
$0 \leq b \leq 0.35$,
$0.01 \leq a+b \leq 0.35$,
$0 < c \leq 0.9$,
$0 < d \leq 0.5$, and
$0.3 \leq x \leq 0.5$.

Moreover, the basic composite of this embodiment can be obtained in a similar manner as above, except with the following limitations. Specifically, the general expression to be applied is $$x \cdot Pb(Zn_\frac{1}{3}Nb_\frac{2}{3})O_3 - y \cdot Pb(Mg_\frac{1}{3}Nb_\frac{2}{3})O_3.$$

Figure 3:
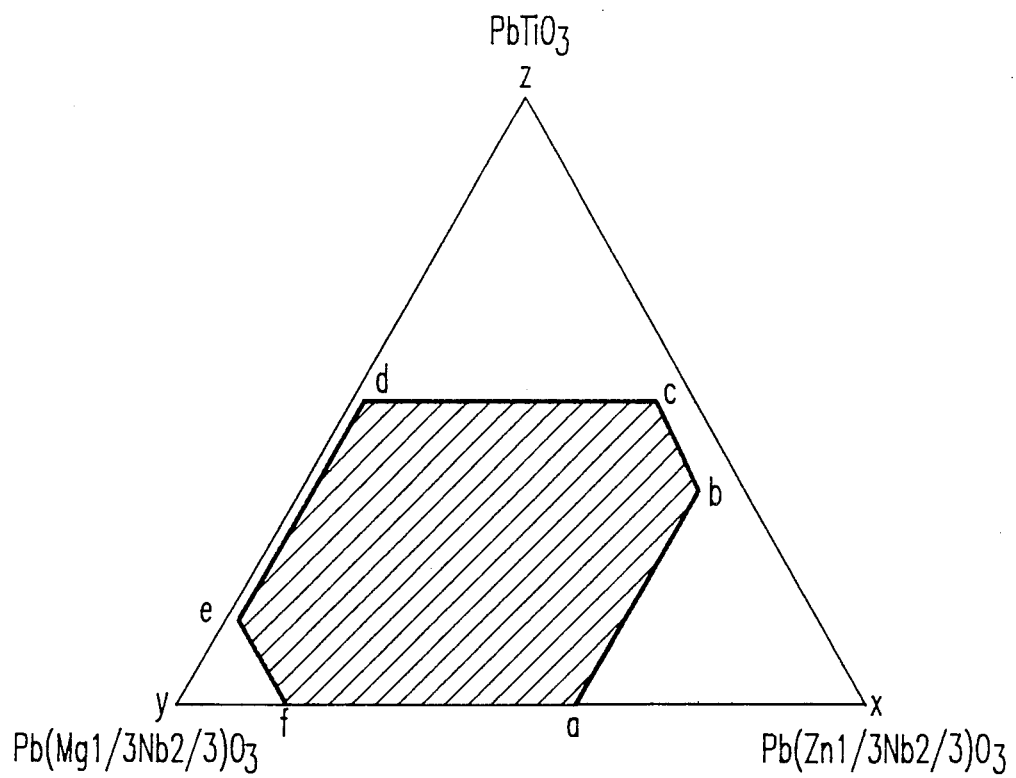
FIG. 3 is a ternary phase diagram illustrating still another example of a major component of the dielectric material in the first embodiment according to the present invention.

$z \cdot PbTiO_3$, where the following conditions must be satisfied as shown in FIG. 3:

a ($x=0.60$, $y=0.40$, and $z=0.00$),
b ($x=0.60$, $y=0.05$, and $z=0.35$),
c ($x=0.45$, $y=0.05$, and $z=0.50$),
d ($x=0.01$, $y=0.49$, and $z=0.50$),
e ($x=0.01$, $y=0.85$, and $z=0.14$), and
f ($x=0.15$, $y=0.85$, and $z=0.00$).

Further, in this case, the Pb is substituted by Ca of about 2 mol % to about 30 mol %.

In the process of manufacturing a multilayer ceramic capacitor element, a binder and a solvent are added to the above-described material powder so as to form a slurry. The slurry is cast into green sheets by the use of a caster. Thereafter, inner electrodes are printed on the green sheets, respectively. Next, the prescribed number of the sheets are multi-layered, laminated using pressure, and fired. In this case, the dielectric materials of this invention can be fired at a relatively low temperature. Thus, less costly materials such as Ag major (Ag of about 80 to 50%, Pb of about 20 to 50%) can be used as a material of the inner electrodes. Moreover, the composite of this invention can be advantageously used as a thick film dielectric paste. The paste is printed on a printed circuit board, and then fired at a low temperature.

The ceramic composite of this invention has a high dielectric constant and satisfactory temperature characteristics, and exhibits a sufficiently large CR value even at high temperatures. Thus, a highly reliable ceramic composite can be obtained. Moreover, the composite of this invention has a dielectric constant substantially independent of a biased electric field applied thereto. For example, a material whose dielectric constant varies only about 10% in a field of 2 KV/mm can be obtained. Thus, it is advantageous to use the composite of this invention as a material for high-voltage applications. Further, the composite of this invention has a small dielectric loss. Thus, the composite can be advantageously applied to alternating-current circuits and high-frequency circuits. In addition, the composite of this invention has a dielectric constant that exhibits small temperature dependence. Thus, the composite can be used for a minute displacement element which utilizes piezoelectric effects and electrostriction effects. In this case, less temperature-dependent characteristics can also be obtained.

Hereinafter, examples in this embodiment will be described with reference to Tables 1 and 2. First, oxides of Pb, Ba, Sr, Zn, Nb and Mg were mixed in a prescribed proportion. The thus obtained source material was calcined at about 700° C. to about 850° C. Thereafter, the thus fired material was ground by the use of a ball mill and reduced to powder. The powder was dried, and then glass powder shown in Table 1 was added to the dried powder. The added glass powder was ground by use of the ball mill and reduced to powder.

TABLE 1

| constituents NO. | (wt %) | | | | | | |
|---|---|---|---|---|---|---|---|
| | $BaO_3$ | $SiO_2$ | $Al_2O_3$ | BaO | SrO | CaO | MgO |
| 1 | 20 | 35 | 20 | 10 | 0 | 10 | 5 |
| 2 | 20 | 30 | 20 | 10 | 10 | 0 | 10 |
| 3 | 40 | 10 | 15 | 20 | 10 | 0 | 5 |
| 4 | 50 | 20 | 10 | 5 | 0 | 10 | 5 |
| 5 | 65 | 15 | 5 | 5 | 0 | 0 | 10 | sheets, each having the prescribed pattern, were prepared. Such twenty green sheets were stacked and laminated using pressure so as to form a multilayer structure. Then, the formed multilayer structure was cut into a prescribed shape. Thereafter, binder burn out of the multilayer ceramic capacitor was carried out and it's fired at about 1020° C. for about 2 hours. Next, Ag paste was applied to the terminations of the multilayer ceramic capacitor and fired.

Table 2 shows electrical properties of multilayer ceramic capacitors manufactured as described above. As shown in Table 2, fifteen different types of examples designated by No. 1 through 15, and a comparison example No. 1, were prepared. Each example included 20 pieces of the capacitors for measuring electrical proper-

TABLE 2

| | $(Pb_{1-x}Me_x)[(Zn_{\frac{1}{3}}Nb_{\frac{2}{3}})_x(Mg_{\frac{1}{3}}Nb_{\frac{2}{3}})_yTi_z]O_3$ + glass(wt %) | | | | | | |
|---|---|---|---|---|---|---|---|
| | Me = Ba (mol %) | Me = Sr (mol %) | x (mol %) | y (mol %) | z (mol %) | glass component | glass component amount (wt %) |
| example capacitors | | | | | | | |
| 1 | 5 | 0 | 50 | 50 | 0 | 1 | 0.01 |
| 2 | 5 | 0 | 50 | 50 | 0 | 1 | 0.1 |
| 3 | 5 | 0 | 50 | 50 | 0 | 1 | 1 |
| 4 | 8 | 0 | 40 | 50 | 10 | 2 | 0.01 |
| 5 | 8 | 0 | 40 | 50 | 10 | 2 | 0.1 |
| 6 | 8 | 0 | 40 | 50 | 10 | 2 | 1 |
| 7 | 0 | 7 | 55 | 40 | 5 | 3 | 0.01 |
| 8 | 0 | 7 | 55 | 40 | 5 | 3 | 0.1 |
| 9 | 0 | 7 | 55 | 40 | 5 | 3 | 1 |
| 10 | 15 | 0 | 30 | 50 | 20 | 4 | 0.01 |
| 11 | 15 | 0 | 30 | 50 | 20 | 4 | 0.1 |
| 12 | 15 | 0 | 30 | 50 | 20 | 4 | 1 |
| 13 | 0 | 10 | 35 | 60 | 5 | 5 | 0.01 |
| 14 | 0 | 10 | 35 | 60 | 5 | 5 | 0.1 |
| 15 | 0 | 10 | 35 | 60 | 5 | 5 | 1 |
| comparison example capacitor No.1 | 5 | 0 | 50 | 50 | 0 | 1 | 0 |

| | dielectric constant at 25° C. | dielectric loss (%) | temperature coefficient of capacitance (T.C.C.) (%) | | CR value (ΩF) initial value | NO. of life failure after high-temperature load test | NO. of life failure after withstanding voltage test |
|---|---|---|---|---|---|---|---|
| | | | −25° C. | +85° C. | | | |
| example capacitors | | | | | | | |
| 1 | 10000 | 1.5 | −30 | −38 | 21.000 | 0/200 | 0/200 |
| 2 | 10000 | 1.5 | −30 | −38 | 21.000 | 0/200 | 0/200 |
| 3 | 9500 | 1.5 | −30 | −38 | 21.000 | 0/200 | 0/200 |
| 4 | 11000 | 1.6 | −21 | −26 | 11.000 | 0/200 | 0/200 |
| 5 | 11000 | 1.6 | −21 | −26 | 11.000 | 0/200 | 0/200 |
| 6 | 10500 | 1.7 | −21 | −26 | 11.000 | 0/200 | 0/200 |
| 7 | 10500 | 1.5 | −47 | −42 | 10.000 | 0/200 | 0/200 |
| 8 | 10500 | 1.5 | −47 | −42 | 10.000 | 0/200 | 0/200 |
| 9 | 10000 | 1.5 | −47 | −42 | 10.000 | 0/200 | 0/200 |
| 10 | 7000 | 1.7 | −41 | −37 | 5.000 | 0/200 | 0/200 |
| 11 | 7000 | 1.7 | −41 | −37 | 5.000 | 0/200 | 0/200 |
| 12 | 6500 | 1.8 | −41 | −37 | 5.000 | 0/200 | 0/200 |
| 13 | 9000 | 1.9 | −40 | −43 | 10.000 | 0/200 | 0/200 |
| 14 | 9000 | 1.9 | −40 | −43 | 10.000 | 0/200 | 0/200 |
| 15 | 8500 | 1.9 | −40 | −43 | 10.000 | 0/200 | 0/200 |
| comparison example capacitor No.1 | 10000 | 1.5 | −30 | −38 | 21.000 | 38/200 | 15/200 |

The thus obtained powder was dried. Thereafter, a binder and an organic solvent were added to the dried powder, and a slurry was obtained. Next, the thus obtained slurry was cast into a green sheet about 30 μm thick by the use of a doctor blade-type caster. Next, electrode paste of 70 Ag/30 Pd was printed on the green sheet in a prescribed pattern. Twenty green ties thereof, and 200 pieces of the capacitors for reliability tests. Each example was prepared employing materials such as Pb, Ba, Sr, Zn, Nb and Mg in different constitutive proportion. Further, different types of glass components designated by No. 1 through 5 of Table 1 were added respectively to the examples. The measurements of the capacitors were obtained in the following manner, and the averaged values of each 20-piece example are shown in Table 2.

Specifically, the insulation resistance of the capacitors was measured at 25° C. by the use of an insulation resistance-meter after the application of about 25 V D.C. for about 2 minutes. The dielectric loss and capacitance of the capacitors were measured by the use of a digital LCR-meter under the condition in which 1 KHz of 1 Vrms was applied at 25° C. The dielectric constants of the capacitors were calculated on the basis of these measurements. The CR value (the product of the capacitance and resistance) was obtained from the result of (dielectric constant at 25° C.×(insulation resistance at 25°)×(dielectric constant under vacuum). The temperature coefficient of the capacitance (T.C.C.) was represented by the changes of the capacitance at −25° C. and a +85° C. respectively in comparison with that at 25° C. The reliability tests such as the high-temperature load life test and the withstanding voltage test were performed in the following manner.

Specifically, the capacitors were placed in a chamber and exposed to an atmosphere of 120° C. for about 500 hours while a voltage of about 100 V D.C. was applied thereto. Thereafter, the CR values of the capacitors were measured. The capacitors whose CR values were less than 1000 ΩF were counted as failures. Further, a voltage of about 300 V D.C. was applied to the capacitors at 25° C. for about 1000 hours. Thereafter, the capacitors were tested to determine whether they had broken down.

Moreover, in this embodiment, the glass component may become a liquid phase during the manufacturing process. Thus, the sintering of the composite can be performed at lower temperatures than that of the conventional composite. Specifically, in the conventional technique, the composite must be sintered at temperatures between about 1050° C. and about 1150° C. Otherwise, the composite will not be sufficiently sintered. According to the present invention, the sintering of the composite can be performed at temperatures between about 950° C. and about 1100° C. Further, the composite of this invention can be steadily sintered without precise control of the sintering temperature. This is advantageous to mass-produce multilayer ceramic capacitors.

Further, when the composite of this invention is employed in manufacturing multilayer ceramic capacitors, less costly Ag/Pd electrode paste can be applied. In addition, the composite of this invention is hardly reduced even when being exposed to a reducing atmosphere of $N_2$ and the like. Thus, the composite can be applied to the process of manufacturing multilayer ceramic capacitors using electrode paste of base metals, such as Ni, Cu and the like. This is also advantageous to reduce the production cost.

In the conventional technique of sintering a ceramic composite of the Pb group, a dense sagger or a setter has been used. The sagger or setter, either of which is made of expensive MgO or $Al_2O_3$, serves to suppress the evaporation of the Pb. However, according to the present invention, such sintering can be performed by the use of a less costly porous sheath or setter.

Next, a second embodiment according to the present invention will be described. In this embodiment, a high-dielectric constant ceramic composite is provided which comprises a component having a perovskite compound of the Pb group as a major component. In view of the micro-structure of the sintered composite of this embodiment, an amorphous phase comprising Pb and Si is formed at a triple point. In this case, a triple point is defined as a point at which three particles or more are collected. The inventors of this invention discovered that the composite having the above-described triple point exhibits a significantly enhanced reliability under the high temperature and humidity load life tests. Further, the composite in this embodiment has a high withstanding voltage and a dielectric constant less dependent on the DC-biased field.

In this embodiment, various types of relaxor components may be employed. For example, there can be cited relaxer components including basic components such as $Pb(Mg_{\frac{1}{3}}Nb_{\frac{2}{3}})O_3$, $Pb(Zn_{\frac{1}{3}}Nb_{\frac{2}{3}})O_3$, $PbTiO_3$, $PbZrO_3$, $Pb(Fe_{\frac{1}{2}}Nb_{\frac{1}{2}})O_3$, $Pb(Fe_{\frac{2}{3}}W_{\frac{1}{3}})O_3$, $Pb(Mg_{\frac{1}{2}}W_{\frac{1}{2}})O_3$ and $Pb(Ni_{\frac{1}{3}}Nb_{\frac{2}{3}})O_3$. Naturally, a complex group of these basic components may be employed. Further, relaxer components may include various type of additives such as $MnO_2$, $Co_2O_3$, $La_2O_3$, $Sb_2O_3$, NiO, $ZrO_2$ and $Y_2O_3$ by the amount of 0.5 wt % at a maximum.

Here, assume that a composite, which includes at least one of the above-described $Pb(Mg_{\frac{1}{3}}Nb_{\frac{2}{3}})O_3$ and $Pb(Zn_{\frac{1}{3}}Nb_{\frac{2}{3}})O_3$ by the amount of 50 mol % at a minimum, is employed as the relaxor component. This results in a satisfactory material having a high dielectric constant and excellent life performance. In this case, the dielectric constant and insulation resistance of the material can be more significantly enhanced by substituting at least one of Ba, Sr and Ca for Pb atoms of 1 to 35 mol %.

More preferable relaxor component can be obtained in following manner. Specifically, a part of the Pb (later described) is substituted by at least one of Ba and Sr by about 1 mol % to about 35 mol %. Here, the above-described part of the Pb is defined as follows. First, assume that the perovskite compound, which is a major component of the relaxer, is represented by the general expression of

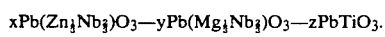

$$xPb(Zn_{\frac{1}{3}}Nb_{\frac{2}{3}})O_3 - yPb(Mg_{\frac{1}{3}}Nb_{\frac{2}{3}})O_3 - zPbTiO_3.$$

Figure 4:
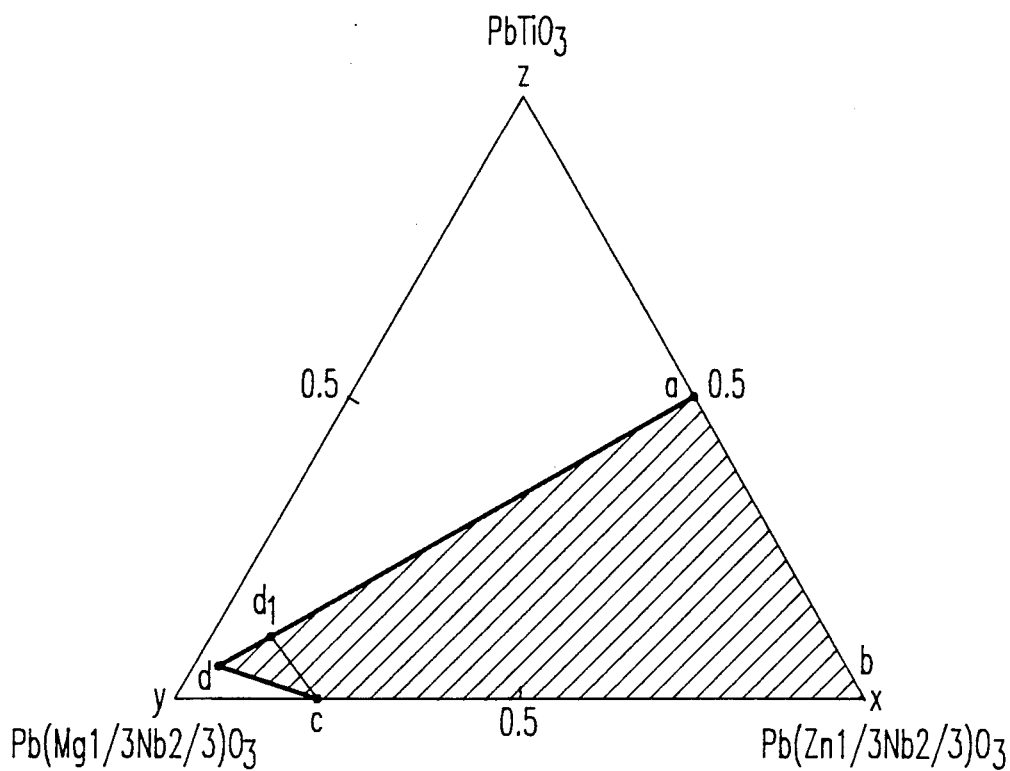
FIG. 4 is a ternary phase diagram illustrating an example of a major component of the dielectric material in the second embodiment according to the present invention.

Three components of this expression are shown as apexes x, y and z in a prescribed ternary phase diagram of FIG. 4. The above-described part of the Pb is limited in the area surrounded by lines a—b, b—c, c—d and d—a including those points on all the lines except line a—b. In this chart, the respective points are determined as follows, a (x=0.50, y=0.00, and z=0.50),
b (x=1.00, y=0.00, and z=0.00),
c (x=0.20, y=0.80, and z=0.00), and
d (x=0.05, y=0.90, and z=0.05).

As described above, the basic composite of this embodiment is limited to the area surrounded by the lines connected to the points a, b, c and d as shown in FIG. 4. This is because when the basic composite is present outside the area, e.g., beyond the line a—d, the firing temperature is required to be 1100° C. or higher. Further, the insulation resistance of the composite is lowered, and thus the product of the capacitance and the resistance thereof is also lowered. Moreover, when the basic composite is present beyond the line c—d, the dielectric constant thereof is significantly lowered. This is because the Curie temperature thereof is inherently in the region of normal temperature, and the substitution by the Me component can easily occur. Further, when the point d changes to a point $d_1$ (where x=0.10, y=0.80 and z=0.10) as shown in FIG. 4, he area inside the line c—d₁ is more preferable for the basic composite to exist.

As described above, in this embodiment, an amorphous phase is formed at a triple point. This is performed in the following manner. Specifically, a glass component whose softening point is lower than the sintering temperature of the ceramic composite is mixed with the materials of the ceramic composite. Thereafter, the thus obtained mixture is heated at a relatively lower heating rate. For example, the heating is performed at a rate of about 15° C. to about 50° C. per hour starting from a temperature of about 300° C. below a prescribed firing temperature. The heating is continued substantially at the prescribed firing temperature for about 1 to 3 hours. As a result, the glass component can be formed at the triple point.

Thus, the glass phase can be uniformly distributed throughout the entire structure. After the completion of firing, the temperature is decreased rapidly in the following manner. Specifically, the mixture is cooled down at a rate of about 300° C. per hour from the prescribed firing temperature to about 600° C. This rapid cool-down is indispensable to form the amorphous phase at the triple point. If the temperature decrease is slow, a reaction would take place between the amorphous phase and the dielectric particles, potentially resulting in adverse effects upon dielectric properties. The amorphous phase comprises components such as PbO, $B_2O_3$ and $SiO_2$ as major components, and other components such as $ZrO_2$, $TiO_2$ and $Al_2O_3$ which are added to PbO and $SiO_2$.

Hereinafter, examples of this embodiment will be described with reference to Tables 3, 3(2) and 4. First, oxides of Pb, Ba, Sr, Zn, Nb and Mg were mixed in a prescribed proportion. The thus obtained source material was calcined at temperature between about 700° C. and about 850° C. Thereafter, the thus fired material was ground by the use of a ball mill and reduced to powder. The powder was dried, and then glass powder shown in Table 3 was added to the dried powder. The resultant mixture powder was further ground by use of the ball mill. The thus obtained powder was dried. Thereafter, a binder and an organic solvent were added to the dried powder, and a slurry was obtained. Next, the slurry was cast into a green sheet about 30 μm thick using a doctor blade. Next, electrode paste of 70 Ag/30 Pd was printed on the thus obtained green sheets in a prescribed pattern. Twenty green sheets with the prescribed pattern were prepared. Such twenty green sheets were stacked and laminated using pressure. The thus obtained multilayer structure was cut into a prescribed shape.

Thereafter, binder burn out of the multilayer ceramic capacitor was carried out and it's fired in the following manner. Specifically, the firing temperature was increased from the room temperature up to about 800° C. at a rate of about 100° C. per hour. Further, the firing temperature was increased up to about 1050° C. at a rate of about 25° C. per hour. The multilayer ceramic capacitor was then fired at about 1050° C. for about 2 hours. Next, the temperature was decreased from about 1050° C. to about 700° C. at a rate of about 500° C. per hour, and thereafter at a rate of about 100° C. per hour. After the completion of firing, Ag paste was applied to the multilayer ceramic capacitor so as to form terminations. The electrical properties of the thus obtained capacitors were measured in the following manner. Specifically, the dielectric loss and capacitance of the capacitors were measured by the use of a digital LCR meter. The measurement was performed with a voltage of about 1 KHz and 1 Vrms applied to the capacitors at 25° C. The dielectric loss was then calculated on the basis of the measurements. The durability tests of the capacitors were performed in the following manner. Specifically 22 different types of examples and 9 different types of comparison examples were prepared.

Each example included 1000 capacitors, and each comparison example included 1000 capacitors. In the case of the high-humidity load life test, the capacitors were placed in a chamber, and exposed to an atmosphere of about 55° C. and 95% RH. Further, a voltage of 25 V D.C. was continuously applied to the capacitors for about 500 hours. In the case of the high-temperature load life test, the capacitors were placed in the thermostat, and exposed to an atmosphere of about 120° C. Further, a voltage of 150 V D.C. was continuously applied to the capacitors for about 500 hours. After 500 hours the capacitors were examined as to whether they had broken down, i.e., short-circuited or significantly deteriorated in insulated resistance. The broken-down capacitors were counted as defectives in the respective test. In Table 4, such defectives are represented by percent. As can be seen from Table 4, capacitors containing the composite of this embodiment can maintain their satisfactory properties thereof even after the abovedescribed durability tests. As a result, the reliability of the composite in this embodiment can be significantly enhanced.

Table 3 shows the composition of triple points in sintered bodies. As can be seen from Table 3, in addition to lead, Ti, Nb, Zn, etc., are included, which can be regarded as solid solutions derived from the relaxor component. The solid solutions can not be avoided, and the content thereof is usually about 1 wt % or more. Further, lead of the triple points must be 50 wt % at a maximum, and more preferably 35 wt % at a maximum. When the lead of the triple points is excessive, the composite deteriorates in reliability under the high-humidity load life test. As a result, the reliability of the composite is inevitably lowered.

TABLE 3

| types of additives | additive states | $B_2O_3$ | $SiO_2$ | $Al_2O_3$ | BaO | MgO | PbO |
|---|---|---|---|---|---|---|---|
| | | components (wt %) | | | | | |
| 1 | glass | 45 | 20 | 10 | 20 | 5 | 0 |
| 2 | glass | 25 | 40 | 5 | 5 | 5 | 20 |
| 3 | glass | 30 | 15 | 1 | 1.5 | 2.5 | 50 |
| | | components (ppm) | | | | | |
| 4 | oxide | 150 | 200 | 50 | 50 | 50 | 0 |
| 5 | oxide | 450 | 300 | 50 | 40 | 40 | 250 |
| 6 | oxide | 400 | 350 | 40 | 20 | 10 | 0 |
| 7 | oxide | 200 | 250 | 10 | 10 | 30 | 500 |
| 8 | oxide | 300 | 400 | 10 | 20 | 20 | 100 |

TABLE 3 (2)

| types of additives | additive states | components (wt %) | | | | | | | | |
|---|---|---|---|---|---|---|---|---|---|---|
| | | $B_2O_3$ | $SiO_2$ | $Al_2O_3$ | BaO | MgO | PbO | $TiO_2$ | ZnO | $Nb_2O_5$ |
| 1 | glass | 31 | 16 | 2 | 5 | 3 | 27 | 1 | 11 | 4 |

TABLE 3 (2)-continued

| types of additives | additive states | components (wt %) | | | | | | | | |
|---|---|---|---|---|---|---|---|---|---|---|
| | | $B_2O_3$ | $SiO_2$ | $Al_2O_3$ | BaO | MgO | PbO | $TiO_2$ | ZnO | $Nb_2O_5$ |
| 2 | glass | 15 | 33 | 2 | 2 | 2 | 34 | 1 | 8 | 3 |
| 3 | glass | 23 | 13 | 1 | 3 | 1 | 45 | 1 | 9 | 3 |
| 4 | oxide | 19 | 30 | 2 | 2 | 4 | 31 | 1 | 8 | 3 |
| 5 | oxide | 21 | 20 | 1 | 1 | 3 | 40 | 1 | 10 | 3 |
| 6 | oxide | 33 | 29 | 1 | 1 | 1 | 22 | 1 | 12 | 3 |
| 7 | oxide | 12 | 21 | 2 | 2 | 2 | 41 | 1 | 15 | 4 |
| 8 | oxide | 19 | 33 | 2 | 1 | 1 | 30 | 1 | 9 | 4 |

TABLE 4

| | composition (mol %) | | | substitution elements | substitution amount (mol %) | added constituents |
|---|---|---|---|---|---|---|
| | $Pb(Zn_{\frac{1}{3}}Nb_{\frac{2}{3}})O_3$ | $Pb(Mg_{\frac{1}{3}}Nb_{\frac{2}{3}})O_3$ | $PbTiO_3$ | | | |
| example capacitors No. | | | | | | |
| 1 | 20 | 70 | 10 | Ba | 16 | 1 |
| 2 | 20 | 70 | 10 | Ba | 16 | 2 |
| 3 | 20 | 70 | 10 | Ba | 16 | 3 |
| 4 | 35 | 55 | 10 | Ba | 12 | 1 |
| 5 | 35 | 55 | 10 | Ba | 12 | 2 |
| 6 | 35 | 55 | 10 | Ba | 12 | 3 |
| 7 | 15 | 75 | 10 | Sr | 20 | 1 |
| 8 | 15 | 75 | 10 | Sr | 20 | 2 |
| 9 | 15 | 75 | 10 | Sr | 20 | 3 |
| 10 | 15 | 80 | 5 | Sr | 15 | 1 |
| 11 | 15 | 80 | 5 | Sr | 15 | 2 |
| 12 | 15 | 80 | 5 | Sr | 15 | 3 |
| 13 | 40 | 50 | 10 | Ba | 16 | 4 |
| 14 | 40 | 50 | 10 | Ba | 16 | 5 |
| 15 | 30 | 65 | 5 | Sr | 10 | 5 |
| 16 | 30 | 65 | 5 | Sr | 10 | 6 |
| 17 | 30 | 60 | 10 | Ba | 16 | 7 |
| 18 | 30 | 60 | 10 | Ba | 16 | 8 |
| 19 | 25 | 70 | 5 | Sr | 12 | 7 |
| 20 | 25 | 70 | 5 | Sr | 12 | 8 |
| 21 | 40 | 55 | 5 | Ba | 16 | 4 |
| 22 | 40 | 55 | .5 | Ba | 16 | 6 |
| comparison example capacitors No. | | | | | | |
| 1 | 20 | 70 | 10 | Ba | 16 | none |
| 2 | 35 | 55 | 10 | Ba | 12 | none |
| 3 | 15 | 75 | 10 | Sr | 20 | none |
| 4 | 15 | 85 | 5 | Sr | 15 | none |
| 5 | 40 | 50 | 10 | Ba | 16 | none |
| 6 | 30 | 65 | 5 | Sr | 10 | none |
| 7 | 30 | 60 | 10 | Ba | 16 | none |
| 8 | 25 | 70 | 5 | Sr | 12 | none |
| 9 | 40 | 55 | 5 | Ba | 16 | none |

| | additives amount (ppm) | dielectric constant at 25° C. | dielectric loss (1 KHz) (%) | failure(%) under the high humidity load life test | failure(%) under the high temperature load life test |
|---|---|---|---|---|---|
| example capacitors No. | | | | | |
| 1 | 250 | 10400 | 0.87 | 0.8 | 0.5 |
| 2 | 250 | 10400 | 0.87 | 0.8 | 0.4 |
| 3 | 250 | 10400 | 0.87 | 0.7 | 0.3 |
| 4 | 500 | 9500 | 0.96 | 0.7 | 0.4 |
| 5 | 500 | 9500 | 0.96 | 0.9 | 0.4 |
| 6 | 500 | 9500 | 0.96 | 0.8 | 0.3 |
| 7 | 250 | 8800 | 0.92 | 0.6 | 0.5 |
| 8 | 250 | 8800 | 0.92 | 0.9 | 0.5 |
| 9 | 250 | 8800 | 0.92 | 0.7 | 0.3 |
| 10 | 500 | 9900 | 0.89 | 0.8 | 0.3 |
| 11 | 500 | 9900 | 0.89 | 0.8 | 0.4 |
| 12 | 500 | 9900 | 0.89 | 0.6 | 0.5 |
| 13 | see Table 1 | 9500 | 0.93 | 0.9 | 0.5 |
| 14 | see Table 1 | 9500 | 0.93 | 0.8 | 0.4 |

TABLE 4-continued

| | | | | | |
|---|---|---|---|---|---|
| 15 | see Table 1 | 9300 | 0.90 | 0.9 | 0.5 |
| 16 | see Table 1 | 8600 | 0.90 | 0.9 | 0.3 |
| 17 | see Table 1 | 9700 | 0.94 | 0.8 | 0.3 |
| 18 | see Table 1 | 9700 | 0.94 | 0.8 | 0.5 |
| 19 | see Table 1 | 10500 | 0.88 | 0.8 | 0.4 |
| 20 | see Table 1 | 10500 | 0.88 | 0.7 | 0.3 |
| 21 | see Table 1 | 9400 | 0.93 | 0.7 | 0.3 |
| 22 | see Table 1 | 9400 | 0.93 | 0.6 | 0.3 |
| comparison example capacitors No. | | | | | |
| 1 | 0 | 11500 | 0.90 | 23 | 12 |
| 2 | 0 | 10500 | 0.98 | 20 | 11 |
| 3 | 0 | 9700 | 0.95 | 21 | 12 |
| 4 | 0 | 11000 | 0.93 | 18 | 13 |
| 5 | 0 | 10500 | 0.96 | 19 | 15 |
| 6 | 0 | 10900 | 0.94 | 22 | 11 |
| 7 | 0 | 10300 | 0.97 | 23 | 12 |
| 8 | 0 | 11700 | 0.92 | 25 | 12 |
| 9 | 0 | 10500 | 0.96 | | |

Next, a third embodiment according to the present invention will be described. In this embodiment, a high-dielectric constant ceramic composite is provided which comprises the first constitutive component having barium titanate ($BaTiO_3$) as a major component. The composite further comprises a second constitutive component having a perovskite compound including lead (referred to as $PbMO_3$ (M=transition metal)) as a major component. Further, the composite comprises a glass component having at least one of silicon and boron. Specifically, the glass component is added to a composite of the $BaTiO_3$—$PbMO_3$ group having a low temperature coefficient of the dielectric constant thereof. The added glass component serves to maintain the satisfactory porperties of the composite even after the heat-cycle test.

In this case, the content of the glass component can be determined to be such an amount that the properties of the composite of this invention are not deteriorated. Specifically, the amount must be 5 wt % at a maximum with respect to the component of $BaTiO_3$—$PbMO_3$. Further, the composite exhibits the advantageous effects even when a small amount of glass component, between 0.005 wt % and 1.0 wt %, preferably between 0.1 wt % and 1.0 wt % for example, is added. The glass component according to the present invention includes at least one of Si and B. However, the use of silicate glass is preferable, and the silicate glass including Si of 10 wt % at a minimum as converted into $SiO_2$ is more preferable. Further, the glass component according to the present invention may also include other elements, such as B, Al, Ba, Sr, Ca, Li, Mg, Zn and Pb. The preferred proportions of such elements may be selected from the following (represented as converted into corresponding oxides):

| | |
|---|---|
| $SiO_3$ | 10–60 wt % |
| $B_2O_3$ | 0–80 wt % |
| $Al_2O_3$ | 0–20 wt % |
| BaO | 0–20 wt % |
| SrO | 0–20 wt % |
| CaO | 0–20 wt % |
| MgO | 0–20 wt % |
| ZnO | 0–20 wt % |
| $Li_2O$ | 0–30 wt % |

(where the total is 100 wt % in any case.)

Moreover, the use of borosilicate glass, which includes Si and B simultaneously, is preferable. In this case, the borosilicate glass, which includes B of 5 wt % or more and Si of 10 wt % or more (when represented as converted into $SiO_2$), is more preferable. Further, the glass component according to the present invention may also include other elements, such as Al, Ba, Sr, Ca, Li, Mg, Zn and Pb. The preferred proportions of such elements may be selected from the following (represented as converted into corresponding oxides):

| | |
|---|---|
| $SiO_2$ | 10–30 wt % |
| $B_2O_3$ | 5–45 wt % |
| $Al_2O_3$ | 5–20 wt % |
| BaO | 5–20 wt % |
| SrO | 0–15 wt % |
| CaO | 0–5 wt % |
| MgO | 0–15 wt % |
| ZnO | 0–15 wt % |
| $Li_2O$ | 0–20 wt % |

(where the total is 100 wt % in any case.)

In addition, other possible selections may be made in the following manner:

| | |
|---|---|
| $SiO_2$ | 10–25 wt % |
| $B_2O_3$ | 30–45 wt % |
| $Al_2O_3$ | 10–20 wt % |
| BaO | 10–20 wt % |
| SrO | 0–10 wt % |
| CaO | 0–5 wt % |
| MgO | 5–20 wt % |
| ZnO | 0–15 wt % |
| $Li_2O$ | 0–20 wt % |

(where the total is 100 wt % in any case.)

The above-described glass, which does not include Pb or Bi, exhibits significantly improved anti-reduction properties.

The glass component can be obtained in the following manner. Specifically, oxides and carbon oxides of prescribed amounts are melted in a platinum crucible, and cooled down rapidly under water to obtain glass. The thus obtained glass is ground into pieces, which are then passed through a 325-mesh screen (each hole having a diameter of about 40 μm). Thereafter, the glass pieces are further ground into powder by the use of Zirconia balls (each having a diameter of about 1 to 2 mm) and a resin pot. As a result, glass powder, each particle having a diameter of several μm, preferably of about 1 μm, can be obtained.

The $BaTiO_3$ compound can be obtained in the following manner. Specifically, oxides of Ba and Ti, and several salts such as carbonate and nitrate which become oxides by firing are prepared as source materials. Further, hydroxides and organic compounds are also prepared. Such materials are adjusted so as to become $BaTiO_3$, and calcined at temperatures between about 1000° C, and about 1350° C., and then ground into powder. This solid phase reaction technique may be replaced by any one of three other techniques, e.g., coprecipitation, hydrothermal synthesis and lass crystallization. The proportion of the abovedescribed materials may be deviated to some extent from the proportion in view of stoichiometry.

Further, a part of Ba may be substituted by Sr, Ca and Ce. A part of Ti may also be substituted by Zr, Sn and the like. Even after the firing process, the $BaTiO_3$ component and the $PbMO_3$ component must exist individually. For this reason, each particle diameter of the $BaTiO_3$ component must be in a range from about 0.7 μm to about 3 μm, preferably in a range from about 0.8 μm to about 2 μm. Further, the surface area per weight of the $BaTiO_3$ component is required to be about 1 $m^2/g$ through about 3 $m^2/g$. The use of a glass crystallization technique or a hydrothermal synthesis technique is more preferable, because relatively uniform sphere shaped particles with narrow grain size distribution are obtained.

The $PbMO_3$ component can be obtained in the following manner. Specifically, Ti, Zr, Zn, Mg, Ni, Co, Nb, Ta, W, Fe, Mn and the like are used as an M component. In most cases, the M component includes at least two elements selected from the above-recited elements in a prescribed proportion. This is because the valence number must be adjusted so as to improve the properties of the $PbMO_3$ component. Here, assume that one element is selected from Zn, Mg, Ni and Co, and the other element is selected from Nb, Ta and W. This combination significantly exhibits the results obtained from the glass-addition process described above.

Further, when the M component includes a $Pb(Zn_{\frac{1}{3}}Nb_{\frac{2}{3}})O_3$ more significant glass-addition effects can be obtained. Specifically, the $Pb(Zn_{\frac{1}{3}}Nb_{\frac{2}{3}})O_3$ group includes a group which is obtained by substituting Ti, $(Mg_{\frac{1}{3}}Nb_{\frac{2}{3}})$ and the like for $(Zn_{\frac{1}{3}}Nb_{\frac{2}{3}})$ of $Pb(Zn_{\frac{1}{3}}Nb_{\frac{2}{3}})O_3$. Moreover, Ba, Sr, Ca and the like can be substituted by a part of the Pb. Here, the synergistic effect obtained by the combination of the $BaTiO_3$ component and the $PbMO_3$ component reduces the temperature-dependence on the dielectric constant. However, the Curie temperature of the $BaTiO_3$ component is about 125° C. Thus, the Curie temperaturte of the $PbMO_3$ component must be below 100° C., and preferably between 0° C. and about 80° C. The $PbMO_3$ component can be manufactured by use of a solid phase reaction technique, the same manner as in manufacturing the $BaTiO_3$ component.

Specifically, the oxides of Pb, Ba, Sr, Ti, Nb, Zn and Mg are mixed. In other case, materials which change into oxides when fired are mixed. The mixture is then temporarily fired at about 700° C. to about 900° C., and ground thereafter. In the process of grinding, the use of Zirconia balls having high toughness is preferable. This is because such balls prevents impurities from mixing into the material. There has been disclosed another technique of preparing the $PbMO_3$ (see Material Res. Bull. 17, 1245-1250, (1982)). Specifically, a part of the material is manufactured as a coronbite compound. The compound is then reacted with PbO so as to prepare the $PbMO_3$.

As described above, the $BaTiO_3$ component and the $PbMO_3$ component are mixed together and then the glass compound is added. However, if the $BaTiO_3$ component is ground into pieces excessively, the $BaTiO_3$ component and the $PbMO_3$ component form a solid solution. Thus, the glass compound could not be satisfactorily added. To prevent this, in the process of grinding, the use of resin coated balls is preferable. Assume that the mixture of the $BaTiO_3$ component and the $PbMO_3$ component with the satisfactorily added glass component is sintered. The glass component serves to enhance the sintering of the $BaTiO_3$ component and the $PbMO_3$ compoment. Further, the glass component serves to suppress the diffusion between the two components. As a result, a high density of the sintered components can be obtained at relatively lower temperatures. By virtue of the presence of the glasss component, a high-dielectric constant ceramic composite can be obtained. The composite can maintain satisfactory properties even after the heat-cycle test and the high-humidity load test. Further, the composite exhibits close adhesion when used in a multilayer ceramic capacitor between the inner electrodes.

The appropriate proportion of the $BaTiO_3$ component and the $PbMO_3$ component may be determined in the following manners.

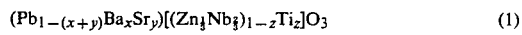
$(Pb_{1-(x+y)}Ba_xSr_y)[(Zn_{\frac{1}{3}}Nb_{\frac{2}{3}})_{1-z}Ti_z]O_3$ (1)

$0.35 \leq x+y \leq 0.6$
$0.3 \leq y \leq 0.5$
$0.05 \leq x \leq 0.15$
$0.4 \leq z \leq 0.6$
(disclosed in J. L, O. P. No. 61-250904)

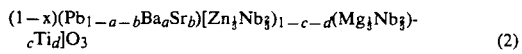
$(1-x)(Pb_{1-a-b}Ba_aSr_b)[Zn_{\frac{1}{3}}Nb_{\frac{2}{3}}]_{1-c-d}(Mg_{\frac{1}{3}}Nb_{\frac{2}{3}})$-$_cTi_d]O_3$ (2)

$0 \leq a \leq 0.35$
$0 \leq b \leq 0.35$
$0.01 \leq a+b \leq 0.35$
$0 \leq c \leq 0.9$
$0 \leq d \leq 0.6$
$0 \leq c+d \leq 1.0$
$0 \leq x \leq 0.65$
(disclosed in J. L. 0. P. No. 63-156062)

In the process of manufacturing a multilayer ceramic capacitor, a binder and a solvent are added to the abovedescribed material powder so as to form a slurry. The slurry is cast into green sheets. Thereafter, the internal electrodes are printed on the respective green sheets. Next, the prescribed number of sheets are multi-layered, laminated using pressure, and then fired. In this case, the composite according to the present invention can be sintered at a relatively low temperature. Thus, low melting-point metals of the Ag group, Cu group, Ni group and Al group can be used as a material of the internal electrodes. As a result, the manufacturing costs can be significantly reduced. Further, the composite of this invention can be applied to a minute displacement element which utilizes piezoelectric effects and electrostriction effects. In this case, less temperature-dependent characteristics can also be obtained. Moreover, the composite of this invention can be advantageously used as a thick film dielectric paste. The paste is printed on a printed circuit board, and fired at a low temperature.

The composite of this invention exhibits satisfactory properties even after the heat-cycle test and the high-humidity load test, as described above. In addition to this, the composition can maintain satisfactory temperature characteristics and a sufficiently large CR value even at higher temperatures. As a result, a highly reliable composite can be obtained. Moreover, the composite of this invention has a dielectric constant less dependent on a biased electric field, e.g., 10% or less under 2 KV/mm. Thus, the composite is advantageous as a material for high-voltage applications.

Further, the composite has small dielectric loss. Thus, the composite can be advantageously applied to alternating-current circuits and high-frequency circuits. Moreover, the grain size of the fired composite is uniform within a range of 1 $\mu$m to 3 $\mu$m. Thus, the composite bas a high withstanding voltage. The electrical properties of this composite have been described. However, the composite also has satisfactory mechanical strength. The composite of this invention may include impurities and additives within certain amounts without degradation of the advantages of this invention. For example, there may be transition metals such as ZnO, $Nb_2O_5$, $Ta_2O_5$, $WO_3$, SrO, $TiO_2$, $Al_2O_3$, MnO, CoO, NiO, MgO, $Sb_2O_3$, $ZrO_2$ and $SiO_2$, and lanthanide elements. The content of these additives must be 1 wt % at a maximum.

Hereinafter, examples in this embodiment will be described with reference to Tables 5 through 10. The constituents of glass employed in this embodiment are shown in Table 5. Further, a $BaTiO_3$ component and a $PbMO_3$ component, both employed in this embodiment, can be represented by the following expressions:

(a) $(1-x)\cdot(Pb_{1-x-y/1-x}Sr_{y/1-x})[(Zn_{\frac{1}{3}}Nb_{\frac{2}{3}})_{1-z/1-x}Ti_{z/1-x}]O_3 - x\cdot BaTiO_3$ (b) $(1-x)\cdot(Pb_{1-a-b}Ba_1Sr_b)[(Zn_{\frac{1}{3}}Nb_{\frac{2}{3}})_{1-c-d}(Mg_{\frac{1}{3}}Nb_{\frac{2}{3}})_cTi_d]O_3 - x\cdot BaTiO_3$ (c) $(1-x)\cdot(Pb_{1-a-b}Ba_aSr_b)[(Zn_{\frac{1}{3}}Nb_{\frac{2}{3}})_{1-c-d}(Mg_{\frac{1}{3}}Nb_{\frac{2}{3}})_cTi_d]O_3 - x\cdot Ba(Ti_{1-e}Zr_e)O_3$ (d) $(1-x)\cdot(Pb_{1-a-b}Ba_aSr_b)[(Mg_{\frac{1}{3}}Nb_{\frac{2}{3}})_{1-c-d}(Ni_{\frac{1}{3}}Nb_{\frac{2}{3}})_cTi_d]O_3 - x\cdot Ba(Ti_{1-e}Zr_e)O_3$ (e) $(1-x)\cdot(Pb_{1-a-b}Ba_aSr_b)[(Mg_{\frac{1}{3}}Nv_{\frac{2}{3}})_{1-c-d}(Mg_{\frac{1}{2}}W_{\frac{1}{2}})_cTi_d]O_3 - x\cdot Ba(Ti_{1-e}Zr_e)O_3$ The $BaTiO_3$ component employed in this embodiment was obtained in the following manner. Specifically, $BaCO_3$ and $TiO_2$ were calcined at temperatures between about 1000° C. and about 1350° C. (typical conditon: at 1250° C.). Thereafter, they were ground for about 1 to 2 hours so as to obtain an e particle diameter of about 0.8 $\mu$m to about 2 $\mu$m. Next, MnO of about 0.1 mol % to about 0.5 mol % was added to the $BaTiO_3$ component. In the case of the $Ba(Ti,Zr)O_3$, $ZrO_2$ was further added as a material.

The glass component was obtained by passing through a 325-mesh screen and being ground by the use of $ZrO_2$ balls. Each of $ZrO_2$ balls was 2 mm in diameter and served to grind the glass component into particles, each having a diameter of about 1 $\mu$m or less.

The $PbMO_3$ component was obtained by use of the abovedescribed solid phase reaction technique. Specifically, the material was calcined in a temperature range from about 700° C. to about 900° C., and then ground into pieces.

The $BaTiO_3$ component, the $PbMO_3$ component and the glass component were uniformly mixed, and then a binder was added to the mixture. The mixture was pressed so as to form a disk having a diameter of about 17 mm and a thickness of about 2 mm. The thus formed disk was sintered at temperatures between about 1000° C. and about 1200° C., being exposed to air. Thereafter, the disk was polished to a thickness of about 0.3 mm. Next, Ag was sputtered onto both sides of the thus polished disk so as to form electrodes. The dielectric loss and capacitance thereof were measured under the condition of 1 KHz, 5 V rms and at 25° C.

The measurement was performed using a digital LCR meter. The dielectric constant was calculated on the basis of these measurements. The dielectric constant variations with respect to the ambient temperatures were expressed on the basis of the dielectric constant at 25° C. Specifically, the maximum variation of the dielectric constant within a temperature range of $-55°$ C. to $+125°$ C. was expressed as a percentage of the dielectric constant at 25° C. Next, twenty dielectric layers, each having a thickness of about 25 $\mu$m, were multi-layered so as to form a multilayer ceramic capacitor (3.2×1.25×1 mm). The thus obtained multilayer ceramic capacitor was attached by soldering to an alumina substrate. The capacitors of the same structure as above were subjected to the heat-cycle test of $-55°$ C. to $+150°$ C. over 100 times. After the heat-cycle test, the properties of some capacitors had deteriorated into the following states. Specifically, the capacitance of some capacitors was reduced by 20% or more. The withstanding voltage of some capacitors was lowered to 200 V or less. The CR values (the product of capacitance and resistance) of some capacitors was reduced to 50 M$\Omega\mu$F or less.

All of these capacitors were counted as failure. The number of failure in twenty capacitors was used to evaluate the quality of the capacitors. Next, the capacitors were subjected to the high-humidity load life test under the following conditions. Specifically, a voltage of 700 V D.C. was applied to the capacitors while they were exposed to an atmosphere of about 85° C. and about 95% R.H. for about 200 hours. During the high-humidity load life test, some capacitors broke down. The number of the broken-down capacitors was used to evaluate the life performance of the multilayer ceramic capacitor.

The following Tables 6 through 10 show the properties of the ceramic capacitors in which various types of composites of this embodiment are employed.

TABLE 5

| Constituent Example | B$_2$O$_3$ | SiO$_2$ | PbO | Al$_2$O$_3$ | BaO | SrO | CaO | MgO | ZnO | Li$_2$O |
|---|---|---|---|---|---|---|---|---|---|---|
| 1 | 0 | 60 | 0 | 20 | 10 | 0 | 0 | 0 | 0 | 0 |
| 2 | 30 | 15 | 0 | 20 | 15 | 10 | 0 | 10 | 0 | 0 |
| 3 | 40 | 10 | 0 | 15 | 20 | 10 | 0 | 5 | 0 | 0 |
| 4 | 60 | 20 | 0 | 10 | 0 | 0 | 0 | 10 | 0 | 0 |
| 5 | 80 | 10 | 0 | 5 | 5 | 0 | 0 | 0 | 0 | 0 |
| 6 | 20 | 1 | 65 | 1 | 0 | 0 | 0 | 0 | 13 | 0 |
| 7 | 2 | 40 | 10 | 0 | 20 | 5 | 5 | 10 | 8 | 0 |
| 8 | 40 | 40 | 0 | 0 | 10 | 0 | 0 | 0 | 0 | 10 |

As seen from Tables 6 through 10, the composites of this invention have high dielectric constants (K ≧ 1500), and satisfactory temperature characteristics in terms of dielectric constant variation (+22% to −33% at −55° C. to

TABLE 6

(Use of component (a))

| | x (mol %) | y (mol %) | z (mol %) | Curie temperature (°C.) | glass component | glass component amount (wt %) | dielectric constant K 25° C. | dielectric loss DL (%) | dielectric const. variation (max.) % to that at 25° C. | number of failure after heat-cycle test | number of failure after high humidity load life test |
|---|---|---|---|---|---|---|---|---|---|---|---|
| comparison example capacitor No. 1 | 40 | 9 | 49 | 0 | — | — | 3060 | 1.1 | −13.7 | 16 | 8 |
| example capacitors | | | | | | | | | | | |
| 1 | 40 | 9 | 49 | 0 | 1 | 0.1 | 2880 | 1.2 | −12.8 | 0 | 0 |
| 2 | 40 | 9 | 49 | 0 | 2 | 0.1 | 2920 | 1.2 | −13.1 | 0 | 0 |
| 3 | 40 | 9 | 49 | 0 | 3 | 0.1 | 3000 | 1.2 | −13.0 | 0 | 0 |
| 4 | 40 | 9 | 49 | 0 | 4 | 0.1 | 2710 | 1.4 | −12.9 | 0 | 0 |
| 5 | 40 | 9 | 49 | 0 | 5 | 0.1 | 2690 | 1.5 | −12.5 | 0 | 0 |
| 6 | 40 | 9 | 49 | 0 | 6 | 0.1 | 2950 | 1.4 | −13.9 | 0 | 0 |
| 7 | 40 | 9 | 49 | 0 | 7 | 0.1 | 2830 | 1.3 | −13.5 | 0 | 0 |
| 8 | 40 | 9 | 49 | 0 | 8 | 0.1 | 2720 | 1.5 | −12.9 | 0 | 0 |
| 9 | 40 | 12 | 55 | −10 | 2 | 0.01 | 3370 | 1.5 | −14.1 | 2 | 1 |
| 10 | 40 | 12 | 55 | −10 | 2 | 0.05 | 3210 | 1.5 | −13.9 | 0 | 0 |
| 11 | 40 | 12 | 55 | −10 | 2 | 0.2 | 3050 | 1.4 | −13.8 | 0 | 0 |
| 12 | 40 | 12 | 55 | −10 | 2 | 1 | 2930 | 1.4 | −13.2 | 0 | 0 |
| 13 | 40 | 12 | 55 | −10 | 2 | 5 | 2760 | 1.5 | −13.1 | 2 | 0 |
| comparison example capacitor No. 2 | 40 | 12 | 55 | −10 | 2 | 10 | 1830 | 1.6 | −12.5 | 15 | 2 |

TABLE 7

(Use of component (b))

| | a (mol %) | b (mol %) | c (mol %) | d (mol %) | x (mol %) | Curie temperature (°C.) | glass component | glass component amount (wt %) | dielectric const. K at 25° C. | dielectric loss DL (%) | diel. const. variation to that at 25° C. | number of failure after heat-cycle test | number of failure after high-humidity load life test |
|---|---|---|---|---|---|---|---|---|---|---|---|---|---|
| comparison example capacitor No. 1 | 0 | 18 | 1 | 19 | 35 | −15 | — | — | 3900 | 1.3 | −18.2 | 13 | 7 |
| example capacitors | | | | | | | | | | | | | |
| 14 | 0 | 18 | 1 | 19 | 35 | −15 | 2 | 0.05 | 3710 | 1.3 | −16.1 | 0 | 0 |
| 15 | 0 | 18 | 1 | 19 | 35 | −15 | 6 | 0.05 | 3500 | 1.2 | −17.5 | 0 | 0 |
| comparison example capacitors No. 4 | 20 | 0 | 0 | 30 | 58 | +30 | — | — | 2140 | 0.9 | −7.0 | 18 | 8 |
| example capacitors | | | | | | | | | | | | | |
| 16 | 20 | 0 | 0 | 30 | 58 | +30 | 1 | 0.2 | 1920 | 0.9 | −9.1 | 0 | 0 |
| 17 | 20 | 0 | 0 | 30 | 58 | +30 | 7 | 0.1 | 1860 | 1.0 | −8.5 | 0 | 0 |

TABLE 8

(Use of component (c))

Curie temperature (°C.)

TABLE 8-continued (Use of component (c))

|  | a (mol %) | b (mol %) | c (mol %) | d (mol %) | e (mol %) | x (mol %) | first component | second component |
|---|---|---|---|---|---|---|---|---|
| comparison example cacitors 5 | 30 | 0 | 80 | 5 | 5 | 60 | 110 | −100 |
| example capacitors |  |  |  |  |  |  |  |  |
| 18 | 30 | 0 | 80 | 5 | 5 | 60 | 110 | −100 |
| 19 | 30 | 0 | 80 | 5 | 5 | 60 | 110 | −100 |
| comparison example 6 capacitors | 0 | 30 | 10 | 40 | 5 | 55 | 110 | −100 |
| example capacitors |  |  |  |  |  |  |  |  |
| 20 | 0 | 30 | 10 | 40 | 5 | 55 | 110 | −100 |
| 21 | 0 | 30 | 10 | 40 | 5 | 55 | 110 | −100 |

|  | glass component | glass component amount (wt %) | dielectric constant K at 25° C. | dielectric loss DL (%) | dielectric constant variation (max.) % to that at 25° C. | number of failure after heat-cycle test | number of failure after high-humidity load life test |
|---|---|---|---|---|---|---|---|
| comparison example cacitors 5 | — | — | 1890 | 0.9 | −8.2 | 12 | 8 |
| example capacitors |  |  |  |  |  |  |  |
| 18 | 2 | 0.05 | 1920 | 1.0 | −11.5 | 0 | 0 |
| 19 | 1 | 0.05 | 1820 | 1.0 | −13.0 | 0 | 0 |
| comparison example 6 capacitors | — | — | 1810 | 0.9 | −8.7 | 9 | 7 |
| example capacitors |  |  |  |  |  |  |  |
| 20 | 2 | 0.05 | 1740 | 0.8 | −9.3 | 0 | 0 |
| 21 | 3 | 0.02 | 1720 | 0.9 | −8.0 | 0 | 0 |

TABLE 9

(Use of component (d))

|  | a (mol %) | b (mol %) | c (mol %) | d (mol %) | e (mol %) | x (mol %) | Curie temperature (°C.) first component | Curie temperature (°C.) second component |
|---|---|---|---|---|---|---|---|---|
| comparison example capacitors 7 | 0 | 1 | 60 | 20 | 2 | 45 | 120 | 10 |
| example capacitors |  |  |  |  |  |  |  |  |
| 22 | 0 | 1 | 60 | 20 | 2 | 45 | 120 | 10 |
| 23 | 1 | 0 | 0 | 10 | 2 | 45 | 120 | 50 |

|  | glass component | glass component amount (wt %) | dielectric const. K at 25° C. | dielectric loss DF (%) | dielectric const. (max) % | numb. of failures after heat-cycle test | numb. of failures after high humidity load life test |
|---|---|---|---|---|---|---|---|
| comparison example capacitors 7 | — | — | 4500 | 1.0 | −17 | 16 | 12 |
| example capacitors |  |  |  |  |  |  |  |
| 22 | 3 | 0.1 | 4200 | 1.1 | −16 | 0 | 0 |
| 23 | 2 | 0.1 | 4400 | 1.0 | −18 | 0 | 0 |

TABLE 10

(Use of component (e))

Curie temperature

TABLE 10-continued (Use of component (e))

|  | a (mol %) | b (mol %) | c (mol %) | d (mol %) | e (mol %) | x (mol %) | first component (°C.) | second component (°C.) |
|---|---|---|---|---|---|---|---|---|
| comparison example capacitors 8 | 0 | 1 | 20 | 25 | 1 | 50 | 121 | 30 |
| example capacitors |  |  |  |  |  |  |  |  |
| 24 | 0 | 1 | 20 | 25 | 1 | 50 | 121 | 30 |
| 25 | 0 | 4 | 56 | 44 | 1 | 50 | 121 | 30 |

|  | glass component | glass component amount (wt %) | dielectric const. K at 25° C. | dielectric loss DF (%) | dielectric const. (max) % | numb. of failures after heat-cycle test | numb. of failures after high humidity load life test |
|---|---|---|---|---|---|---|---|
| comparison example capacitors 8 | 4 | 0.2 | 4100 | 1.2 | −19 | 12 | 18 |
| example capacitors |  |  |  |  |  |  |  |
| 24 | 4 | 0.2 | 3900 | 1.1 | −17 | 0 | 0 |
| 25 | 4 | 0.2 | 3800 | 0.8 | −14 | 0 | 0 |

+125° C.). In addition, the number of failures which occur during the heat-cycle test was reduced significantly. Moreover, even after the high-humidity load life test, the composites of this invention exhibit satisfactory results. Further, in this embodiment, MnO of 0.3 mol % is added to the mixture of a PbMO₃ component and a BaTiO₃ component so as to obtain a base composite. The glass component of the example 2 of Table 5 was added to the base composite. The composite with the added glass component was employed in a multilayer ceramic capacitor. For the sake of comparison, a multilayer ceramic capacitor including only the base composite was also prepared. Both types of capacitors were manufactured in the following manner. Specifically materials were mixed and then an organic solvent was added to the mixture to form a slurry. Thereafter, the slurry was cast into a green sheer of about 50 μm thick. This was performed by the use of a doctor blade-type caster.

Next, electrode paste, which was the mixture of Ag and Pd in proportion of 70/30 (in wt %), was printed on the green sheet so as to form a prescribed patttern. Ten green sheets with the electrode patterns printed thereon were multi-layered and laminated using pressure. Thereafter, the multilayer was cut into the prescribed shape and fired at about 1100° C. After the completion of firing, Ag paste was applied to the multilayer caramic capacitor and fired. The shape of the thus made ceramic capacitors was about 1.6×3.2×0.9 (mm³), and the thickness per layer after firing was about 25 μm. The capacitance of the capacitors was 26 nF without the glass component, and 24 nF with the glass component, respectively. The capacitors with and without the glass component, 50 pieces each, were prepared. These capacitors were subjected to the high-humidity load life test under the following conditions. Specifically, they were exposed to an atmosphere of 95% R.H. at 85° C. for about 1000 hours with D.C. 50 V being continuously applied thereto. The number of failures which occurred during the test is shown in Table 11.

TABLE 11

| case No. | glass component included | the number of failures after |
|---|---|---|
| 21 | none | 13/50 |
| 22 | example 2 of Table 5 by 0.05 wt % | 0/50 |

As can be seen in, Table 11, multilayer ceramic capacitors, which employ the high-dielectric constant ceramic composite including the glass component according to the present invention, exhibit significantly enhanced reliability. In this invention, the glass component is added to the mixture of the PbMO₃ component and the BaTiO₃ component. However, the glass component may also previously be added to the PbMO₃ and calcined.

As described above, according to the present invention, there can be provided a high-dielectric constant ceramic composite having low temperature dependence. The composite can also be significantly improved in terms of the heat-cycle test and the high-humidity load life test. In particular, the reliability of the composite under the heat-cycle test allows the composite to be applied to various type of multilayer ceramic elements such as multilayer ceramic capacitors and multilayer ceramic displacement elements, which are used under severe temperature conditions.

Obviously, numerous additional modifications and variations of the present invention are possible in light of the above teachings. It is therefore to be understood that within the scope of the appended claims, the invention may be practiced otherwise than as specifically described herein.

What is claimed is:

1. A high-dielectric constant ceramic composite comprising:
    a lead-based perovskite compound as a major component; and
    a glass component added to said perovskite compound, said glass component including the following constituents $B_2O_3$ of about 10 wt % to about 80 wt %,
$SiO_2$ of about 10 wt % to about 60 wt %,
$Al_2O_3$ of about 2 wt % to about 20 wt %,
BaO of about 2 wt % to about 20 wt %, and
MgO of about 2 wt % to about 20 wt %, wherein the total amount of said constituents equals 100 wt %, and wherein the amount of said glass component added to said perovskite compound is between about 0.005 wt % and about 1.0 wt %.

2. The composite of claim 1, wherein the glass component further comprises 50 wt % or less of PbO.

3. The composite of claim 1, wherein said perovskite compound comprises $Pb(Zn_{\frac{1}{3}}Nb_{\frac{2}{3}})O_3$.

4. The composite of claim 1, wherein said perovskite compound includes at least one of $Pb(Mg_{\frac{1}{3}}Nb_{\frac{2}{3}})3$ and $Pb(Zn_{\frac{1}{3}}Nb_{\frac{2}{3}})O3$ by 50 mol % at a minimum, and said Pb is partially substituted by at least one of Ba, Sr and Ca.

5. The composite of claim 1, wherein said perovskite compound of the Pb group has a part of the Pb being substituted by at least one of Ba and Sr by about 1 mol % to about 35 mol %, the part of the Pb being defined in such a manner that when said perovskite compound is represented by the general expression of

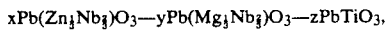
$$xPb(Zn_{\frac{1}{3}}Nb_{\frac{2}{3}})O_3 - yPb(Mg_{\frac{1}{3}}Nb_{\frac{2}{3}})O_3 - zPbTiO_3,$$

three components of which are shown as apexes x, y and z in a prescribed three-element chart, the part of the Pb is limited to the area surrounded by lines a—b, b—c, c—d and d—a including those points on the lines except on the line a—b, where the respective points a, b, c and d are determined as follows, a (x=0.50, y=0.00, and z=0.50),
b (x=1.00, y=0.00, and z=0.00),
c (x=0.20, y=0.80, and z=0.00), and
d (x=0.05, y=0.90, and z=0.05).

6. The composite of claim 1, wherein said glass component also includes SrO of about 20 wt % at a maximum.

7. The composite of claim 1, wherein said glass component also includes CaO of about 20 wt % at a maximum.

8. A capacitor element having a high-dielectric constant ceramic composite comprising:
a lead-based perovskite compound as a major component; and
a glass component added to said perovskite compound, said glass component including the following constituents
$B_2O_3$ of about 10 wt % to about 80 wt %,
$SiO_2$ of about 10 wt % to about 60 wt %,
$Al_2O_3$ of about 2 wt % to about 20 wt %,
BaO of about 2 wt % to about 20 wt %, and
MgO of about 2 wt % to about 20 wt %, wherein the total amount of said constituents equals 100 wt %, and wherein the amount of said glass component added to said perovskite compound is between about 0.005 wt % and about 1.0 wt %.

9. The capacitor element of claim 8, wherein the glass component further comprises 50 wt % or less of PbO.

10. The capacitor element of claim 8, wherein said perovskite compound comprises $Pb(Zn_{\frac{1}{3}}Nb_{\frac{2}{3}})O_3$.

11. The capacitor element of claim 8, wherein said glass component also includes SrO of about 20 wt % at a maximum.

12. The capacitor element of claim 8, wherein said glass component also includes CaO of about 20 wt % at a maximum.

13. A high-dielectric constant ceramic composite comprising:
a first constituent component having barium titanate as a major component;
a second constituent component having a perovskite compound including lead as a major component; and
a glass component having at least one of silicon and boron and being present in a maximum amount of 5 wt % with respect to said first and second constituents.

14. The composite of claim 13, wherein said glass component includes silicate glass.

15. The composite of claim 13, wherein said glass component includes borosilicate glass.

16. The composite of claim 13, wherein said second constituent component includes a perovskite compound of the $Pb(Zn_{\frac{1}{3}}Nb_{\frac{2}{3}})O_3$ group.

17. A capacitor element having a high-dielectric constant ceramic composite as a dielectric, said composite comprising:
a first constituent component having barium titanate as a major component;
a second constituent component having a lead-based perovskite compound as a major component; and
a glass component having at least one of silicon and boron and being present in a maximum amount of 5 wt % with respect to said first and second constituents.

18. The capacitor element of claim 17 wherein said glass component includes silicate glass.

19. The capacitor element of claim 17, wherein said glass component includes borosilicate glass.

20. The capacitor element of claim 19, wherein said second constitutive component includes a perovskite compound of the $Pb(Zn_{\frac{1}{3}}Nb_{\frac{2}{3}})O_3$ group.

21. A capacitor element having a high-dielectric constant ceramic composite comprising:
a leas-based perovskite compound as a major component; and
a plurality of amorphous phases having at least PbO, $B_2O_3$ and $SiO_2$, said amorphous phases being formed at triple points.

22. The capacitor element of claim 21, wherein said perovskite compound includes a glass including the following constitutes
$B_2O_3$ of about 10 wt % to about 80 wt %,
$SiO_2$ of about 10 wt % to about 60 wt %,
$Al_2O_3$ of about 2 wt % to about 20 wt %,
BaO of about 2 wt % to about 20 wt %, and
MgO of about 2 wt % to about 20 wt %; and
said amorphous phases includes PbO of about 50 wt % at a maximum.

23. The capacitor element of claim 21, wherein said perovskite compound includes at least one of $Pb(Mg_{\frac{1}{3}}Nb_{\frac{2}{3}})O_3$ and $Pb(Zn_{\frac{1}{3}}Nb_{\frac{2}{3}})O_3$ by 50 mol % at a minimum, and said Pb is partially substituted by at least one of Ba, Sr and Ca.

24. The capacitor element of claim 21, wherein said perovskite compound of the Pb group has a portion of the Pb being substituted by at least one of Ba and Sr by about 1 mol % to about 35 mol %, the portion of the Pb being defined in such a manner that when said perovskite compound is represented by the general expression of

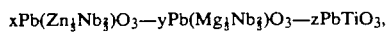
$$xPb(Zn_{\frac{1}{3}}Nb_{\frac{2}{3}})O_3 - yPb(Mg_{\frac{1}{3}}Nb_{\frac{2}{3}})O_3 - zPbTiO_3,$$

three components of which are shown as apexes x, y and z in a prescribed three-element chart, the portion of the Pb is limited to the area surrounded by lines a—b, b—c, c—d and d—a including those points on the lines except on the line a—b, where the respective points a, b, c and d are determined as follows, a (x=0.50, y=0.00, and z=0.50),
b (x=1.00, y=0.00, and z=0.00),
c (x=0.20, y=0.80, and z=0.00), and
d (x=0.05, y=0.90, and z=0.05).

25. The composite of claim 15, wherein said glass component is present in an amount of 0.005–1.0 wt %.

26. The capacitor element of claim 19, wherein said glass component is present in an amount of 0.005–1.0 wt %.

* * * * *